United States Patent
Misaka et al.

[11] Patent Number: 4,998,020
[45] Date of Patent: Mar. 5, 1991

[54] ELECTRON BEAM EXPOSURE EVALUATION METHOD

[75] Inventors: Akio Misaka; Kenji Kawakita; Kenji Harafuji; Hiromitsu Hamaguchi, all of Osaka, Japan

[73] Assignee: Matsushita Electric Industrial Co., Ltd., Japan

[21] Appl. No.: 500,154

[22] Filed: Mar. 28, 1990

[51] Int. Cl.$^5$ ............................................. H01J 37/30
[52] U.S. Cl. .................................. 250/492.2; 250/358
[58] Field of Search ............................. 250/492.22, 398

[56] References Cited

U.S. PATENT DOCUMENTS

| | | | |
|---|---|---|---|
| 4,426,584 | 1/1984 | Bohler et al. | 250/492.22 |
| 4,463,265 | 7/1984 | Owen et al. | 250/398 |
| 4,504,558 | 3/1985 | Bohlen | 250/492.22 |
| 4,520,269 | 5/1985 | Jones | 250/492.22 |
| 4,812,962 | 3/1989 | Witt | 250/492.22 |

OTHER PUBLICATIONS

"Proximity Parameters Determination for Electron Beam Lithography Using a Novel Technique" by C. H. Shaw; 1286 J. Vac. Sci. Technol. 19(4), Nov./Dec. 1981; pp. 1286–1290.

Primary Examiner—Bruce C. Anderson
Attorney, Agent, or Firm—Lowe, Price, Leblanc, Becker & Shur

[57] ABSTRACT

In formation of a fine pattern with direct electron beam delineation, disclosed is a method of obtaining parameters on an electron scattering intensity distribution expressed with a double Gaussian distribution obtained when exposing a resist with an electron beam. A resist on a substrate is exposed with an electron beam in accordance with an evaluation pattern which comprises a plurality of basic checked patterns each comprising longitudinal and lateral exposed stripes. The basic checked patterns are successively arranged longitudinally and laterally at predetermined intervals on a plane so as to form a plurality of longitudinal pattern rows and lateral pattern rows, widths of the stripes of the basic checked patterns in each of the lateral pattern rows being successively changed so as to be different from each other. The exposure doses for the basic checked patterns in each of the longitudinal pattern rows are successively changed so as to be different at every basic checked pattern, thereby obtaining, as a critical exposure dose, the minimum exposure dose in each of the longitudinal pattern rows on the basis of removed or remaining states of the non-exposed portions of the basic checked patterns to obtain the respective parameters.

6 Claims, 9 Drawing Sheets

ELECTRON BEAM EXPOSURE EVALUATION METHOD

BACKGROUND OF THE INVENTION

The present invention relates generally to formation of a fine pattern with direct electron beam delineation, and more particularly to an exposure evaluating method of obtaining an electron beam scattering intensity distribution for a proximity effect correction in the fine-pattern formation.

In performing a so-called electron beam exposure, an electron beam scattering occurs in a resist, by which scattering the exposure area becomes wider than the electron beam illumination area so as to enhance affection of the scattering to make it difficult to obtain a pattern with a desirable dimension. This is referred to as proximity effects. Thus, formation of a fine pattern requires the proximity effect correction.

Generally, the electron beam scattering intensity distribution can be expressed by the following double Gaussian distribution under the condition that in a coordinate system the center point is taken as x1 and the scattering intensity is E(r).

$$E(r - x1) = \frac{1}{\pi(1 + \eta)} \left( \frac{1}{\alpha^2} e^{-\frac{(r-x1)^2}{\alpha^2}} + \eta \frac{1}{\beta^2} e^{-\frac{(r-x1)^2}{\beta^2}} \right) \quad (1)$$

where $\alpha$ represents the spread of the forward scattering occuring in the resist, $\beta$ designates the spread of the back scattering generated by reflection from the substrate, and depicts the reflection coefficient of the back scattering.

When a pattern represented by a region S1 is exposed with an exposure dose (quantity of illumination) $Q_E$, the absorbed dose Q(r) in the coordinate R can be expressed in accordance with the following equation.

$$Q(r) = \integral_{s1} Q_E \cdot E(r-x1) d^2 x1 \quad (2)$$

Secondly, when this pattern is exposed with an exposure dose $Q_{E1}$ and the resist in the coordinate r is first removed after development, the dissolved absorbed dose Qc of the resist can be diven in accordance with the following equation.

$$Qc = \integral_{s1} Q_{E1} \cdot E(r-x1) d^2 x1 \quad (3)$$

When carrying out the proximity effect correction, for forming an expected pattern, after obtaining the exposure region S1 and the exposure dose $Q_{E1}$ to satisfy the condition that the absorbed dose Q(r) in the equation (2) is greater than the dissolved absorbed dose Qc in the region including the expected pattern but smaller than the dissolved absorbed dose Qc, the exposure region S1 is exposed with the exposure dose $Q_{E1}$ so as to result in execution of the proximity effect correction. Although the above description has been made in terms of using a positive resist, with respect to a negative resist, the proximity effect correction can be effected by a similar manner in which the resist-removing portions is considered as resist-remaining portions.

Generally, the proximity effect correction is made by setting a number of evaluation points on the border line of the expected pattern and setting up an equation so as to satisfy the equation (3) on all of the evaluation points, thereby obtaining the exposure region and the exposure dose which satisfy the above-mentioned condition as the solution of the set-up equation. At this time, in the equation (3), the forward scattering spread $\alpha$, the back scattering spread $\beta$, the reflection coefficient $\eta$ and the resist dissolved absorbed dose Qc becomes parameters depending upon a process. Here, these parameters depend upon the material of the resist, development condition of the resist, material of the substrate, acceleration voltage of the electron beam and others and are hence required to be renewed if at least one of them changes. Further, of the aforementioned parameters, the resist dissolved absorbed dose Qc can be easily obtained because it can be defined as the exposure dose at the time that the film thickness of the resist first becomes zero when exposing a pattern extremely wider than the scattering length of the electron beam. Accordingly, it is required to easily obtain $\alpha$, $\beta$, and $\eta$ of the aforementioned parameters. In addition, in the equation (3), $\alpha$ is generally known to be about 0.1 to 0.3 μm and the correction effect can be obtained even if approximating as $\alpha = 0$, and therefore there is no problem in terms of obtaining only $\beta$ and $\eta$.

A description will be made hereinbelow with respect to known methods of obtaining the parameters $\alpha$, $\beta$, and $\eta$.

EXAMPLE 1

The smallest exposure patterns whose number is n and which is possible with an exposure apparatus to be used are arranged to be separated from each other by a predetermined distance so as not to be affected by the scattering of the electron beam and are respectively exposed with exposure doses Q1 to Qn (Q1<Q2<Q3<...<Qn). After development, length measurement is performed with respect to radii r1, r2, r3, ... rn of circular portions formed by resist removals corresponding to the respective exposure doses Q1, Q2, Q3, ..., Qn. Secondly, a scattering intensity distribution curve is obtained by plotting the resist removal dimension r with respect to the exposure dose $Q_E$. Thereafter, the parameters $\alpha$, $\beta$ and $\eta$ in the electron beam scattering intensity distribution equation are obtained by using the method of least square under the condition that the scattering intensity distribution curve satisfies the conditions indicated by the equation (3). In this method, although the configuration and size of the exposure pattern is not limited in principle, the exposure pattern with the exposure-allowable minimum dimension is generally used. The reasons are as follows. That is, it is generally known that $\alpha$ is 0.1 to 0.3 μm and $\beta$ is 2 to 4 μm, and it is required to acurately measure lengths below 0.1 μm for accurate length-measurement of a portion affected by the forward scattering. Further, the method of least square is finally used to obtain the parameters $\alpha$, $\beta$ and $\eta$ from the observation data and the direct use of the equation (3) requires solving non-linear simultaneous equations, resulting in an extremely difficult analysis method. Use of the exposure-allowable minimum dimension exposure pattern permits disregarding the integral of the equation (3), thereby simplifying the equation.

EXAMPLE 2

It is possible to obtain a curve satisfying the equation (3) without effecting the length-measurement. When exposure line patterns L1 and L2 equal in dimension to each other are arranged to be separated by a predetermined distance d from each other as illustrated in FIG. 2 and exposed with the same exposure dose, the absorbed dose at the midpoint O between the two line patterns L1 and L2 is given as a function of the distance d. At this time, if realizing the dissolved absorbed dose at this midpoint O, after development, a portion of the resist between the two line patterns L1 and L2 is removable. Thus, if the exposure dose in first removing the resist portion between the two line patterns L1 and L2 is taken as the critical exposure dose, by obtaining the critical exposure doses E1, E2, E3, ... En for removing resist between two line patterns L1 and L2 which are spaced so as to have distances d1, d2, d3, ..., dn(d1<d2<d3< ... <dn), it is possible to obtain a characteristic curve, as illustrated in FIG. 3, which satisfies the equation (3) and to obtain the respective parameters by using the method of least square with respect to the FIG. 3 curve. Here, although removing the resist between the two line patterns L1 and L2, it is also possible to simultaneously remove resists between a plurality of line patterns which have the same dimension and which are arranged at a predetermined interval as disclosed in J. Vac Sci. Technol, Vol. 19, No. 4, 1286-1290 (1981). This method is also applicable to a negative resist.

However, in the above-described example 1, in order to obtain the scattering intensity distribution curve as illustrated in FIG. 1, it is required to accurately measure a number of patterns each having a dimention below submicron, but the border between the resist and the substrate in such a fine pattern is not clear, thereby resulting in difficulty of the accurate measurement. Further, in the example 2, the resist between the line patterns L1 and L2 is not necessarily dissolved completely and therefore it is difficult to determine whether the resist is separated from the substrate. In addition, since all the patterns have areas which cannot disregard the integral of the equation (3), the equation (3) for satisfying the FIG. 3 characteristic curve becomes extremely complex and use of the non-linear method of least square is required to obtain the respective parameters $\alpha$, $\beta$ and $\eta$ from the FIG. 3 curve, thereby resulting in tedious calculations.

SUMMARY OF THE INVENTION

It is therefore an object of the present invention to provide an electron beam exposure evaluating method which is capable of simply obtaining parameters necessary for the proximity effect correction.

With this and other objects which will become apparent as the description proceeds, according to the present invention, a method of obtaining parameters including a forward scattering parameter, a back scattering parameter and a reflection coefficient parameter on an electron scattering intensity distribution expressed with a double Gaussian distribution obtained when exposing a resist with an electron beam, comprises the steps of: a) preparing an evaluation pattern comprising a plurality of basic checked patterns each comprising longitudinal stripes and lateral stripes to form cross stripes, said plurality of basic checked patterns being successively arranged longitudinally and laterally at predetermined intervals on a plane so as to form a plurality of longitudinal pattern rows and a plurality of lateral pattern rows, and widths of the stripes or intervals between the stripes of the basic checked patterns in each of the lateral pattern rows being successively changed so as to be different from each other; (b) exposing an resist, applied on a substrate, with an electron beam in accordance with the evaluation pattern so that portions of the stripes of each of the basic checked patterns are exposed and portions between the stripes thereof are non exposed, thereby obtaining an exposed pattern corresponding to the evaluation pattern, the exposure doses for the basic checked patterns in each of the longitudinal pattern rows being successively changed so as to be different at every basic checked pattern; (c) developing said evaluation-pattern exposed resist for a predetermined time period and then obtaining, as a critical exposure dose, the minimum exposure dose in each of the longitudinal pattern rows, where the stripe widths or stripe interval are constant, on the basis of removed states (positive resist) or remaining states (negative resist) of the non-exposed portions of the basic checked patterns; and (d) obtaining the parameters of the electron scattering intensity distribution on the basis of the obtained critical exposure doses in accordance with the method of least square.

BRIEF DESCRIPTION OF THE DRAWINGS

The object and features of the present invention will become more readily apparent from the following detailed description of the preferred embodiments taken in conjunction with the accompanying drawings in which.

DETAILED DESCRIPTION OF THE INVENTION

A first embodiment will be described hereinbelow with reference to FIG. 4 in which there is illustrated a basic exposure pattern 1 (one block) comprising exposed portions 2 and non-exposed portions 3 so as to form a two-dimentional periodic pattern. The exposed portions 2 comprises cross stripes so as to form a checked configuration and each of the stripes has a width of u, and the non exposed portions 3 comprises a plurality of square regions surrounded by the exposed portions 2, each side having a length of w. The basic exposure pattern 1 is formed to have a dimension (for example, 100 μm) which is extremely greater than the scattering length of the electron beam so as to allow easy discrimination by an optical microscope. When exposing this basic exposure pattern 1, the affection of the electron beam scattering is only below several microns, and therefore the absorbed doses at the center portions of the non-exposed portions 3 other than the non-exposed portions 3 presented in the range from the ends of the basic exposure pattern 1 up to several microns become equal to each other. Thus, if exposing the basic exposure pattern 1 with the exposure dose whereby the absorbed dose at the center of the non-exposed portion 3 becomes the dissolved absorbed dose, after development, the resist of the entire basic pattern 1 is simultaneously removed. Whereas, the exposure with a less exposure dose produces a checked configuration.

Figure 1:
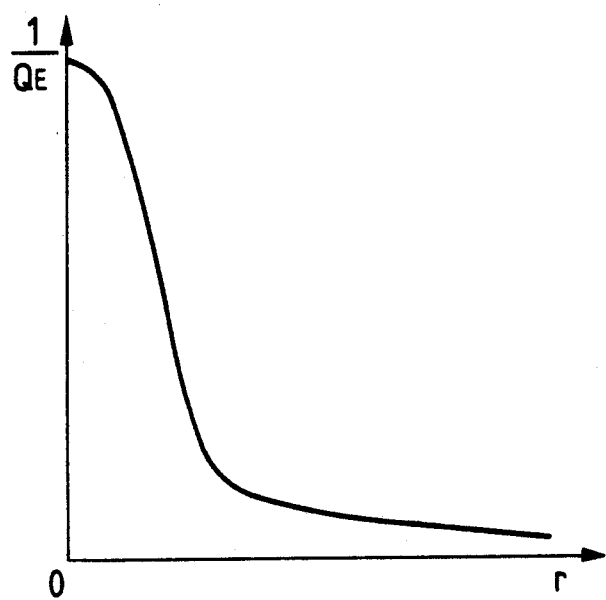
FIG. 1 is a graphic diagram showing the relation between exposure doses and removing dimentions in a prior art technique.
Figure 2:
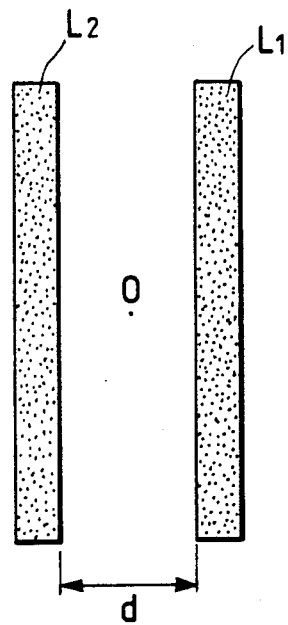
FIG. 2 is an illustration of a pattern arrangement in a prior art technique.
Figure 3:
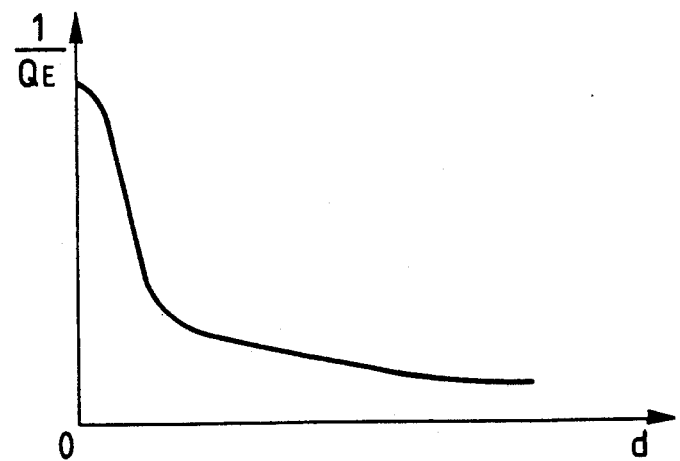
FIG. 3 is a characteristic curve diagram showing the relation between the interval of lines and exposure dose.
Figure 4:
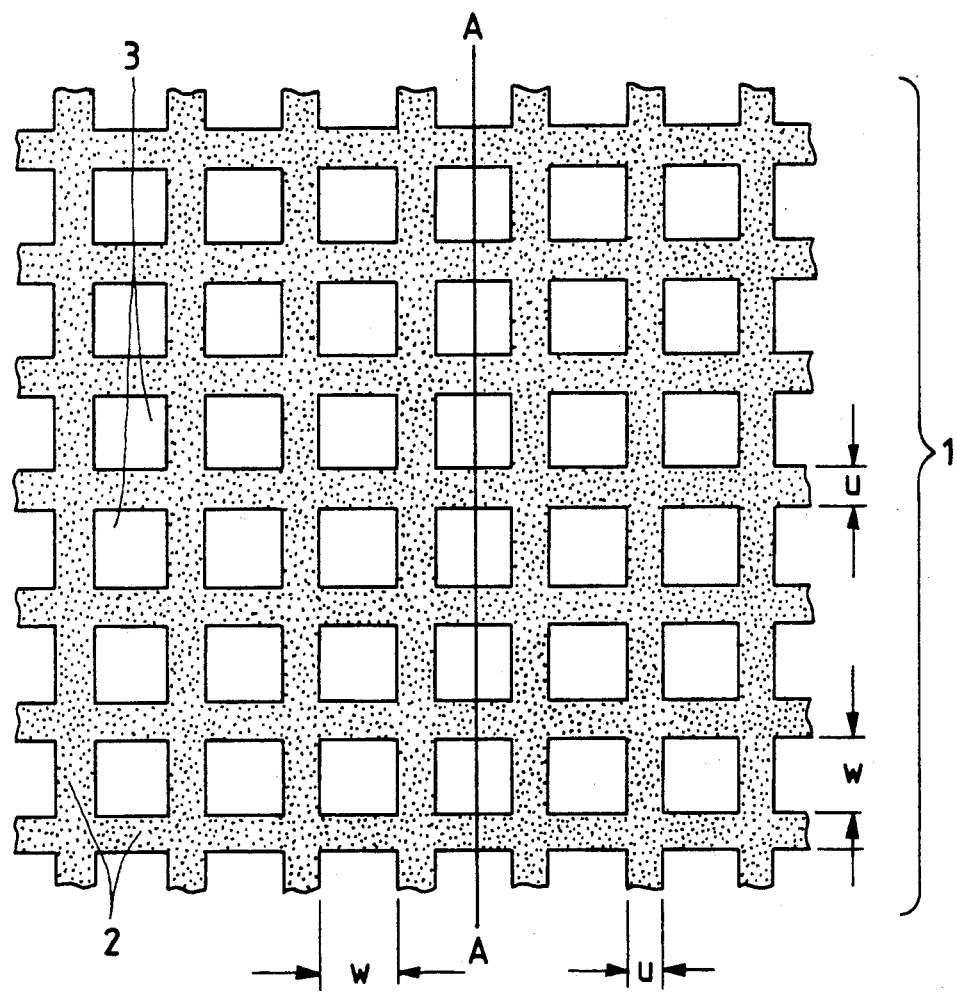
FIG. 4 is an illustration of a basic checked exposure pattern used in a first embodiment of the present invention.
Figure 5:
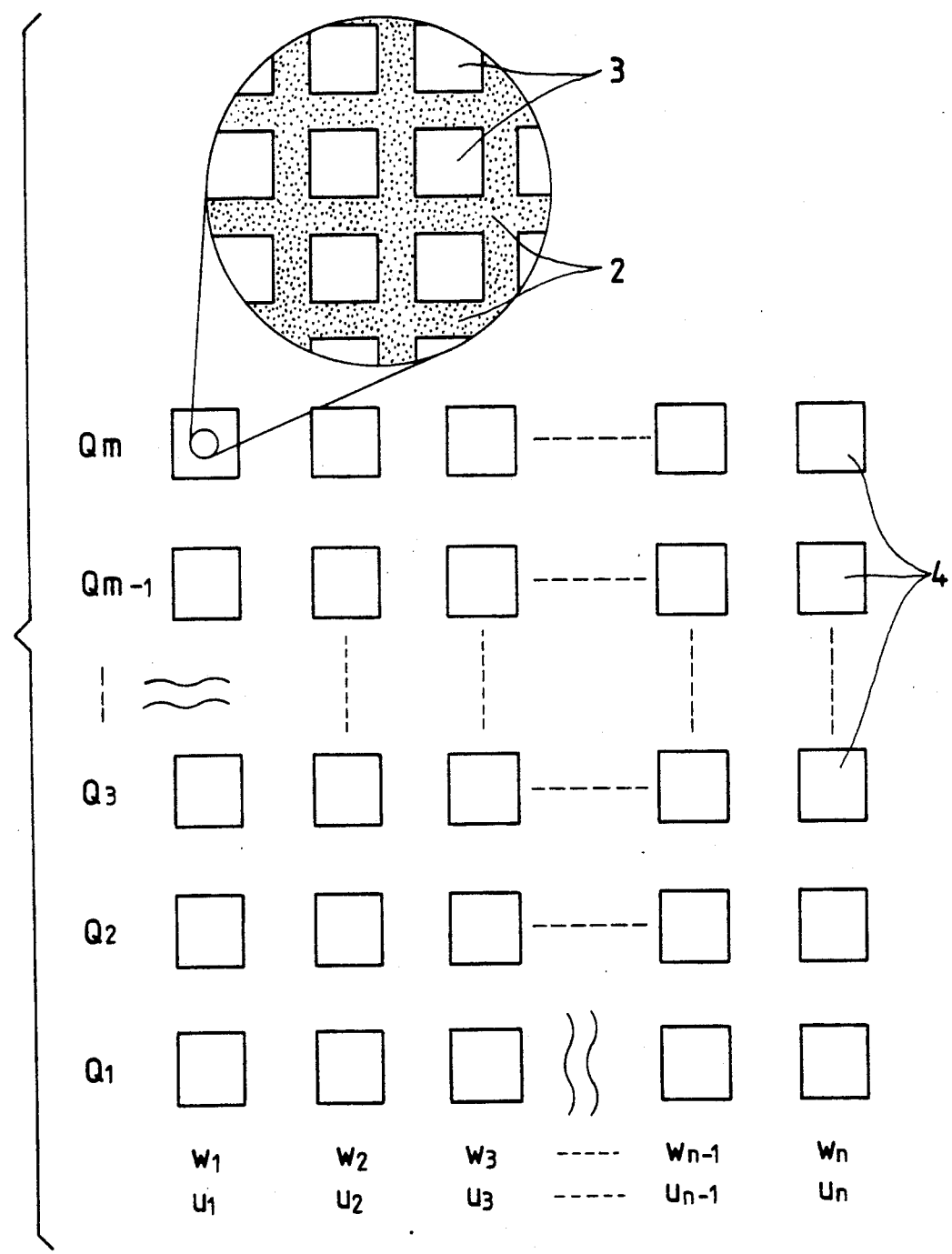
FIG. 5 is an illustration of an evaluation pattern used in the first embodiment of this invention.

FIG. 5 shows an arrangement of the respective basic exposure patterns (blocks) where numeral 4 represents two-dimentional periodic patterns as illustrated in FIG. 4. In the respective blocks successively arranged laterally by n and longitudinally by m so as to form n lateral block rows and m longitudinal block rows as illustrated in FIG. 5, the widths of the exposed portions 2 of the blocks in each lateral low are varied to be successively increased from the left side to the right side so as to be respectively u1, u2, u3, ... un(u1 ≦u2≦u3≦ .... ≦un) and similarly the one-side lengths of the non-exposed portions 3 thereof are successively changed to be respectively w1, w2, w3, ..., wn ( w1≦w2≦w3≦ .... ≦wn), and the exposed portions 2 and the non-exposed portions 3 of the blocks in each longitudinal row have the same width and one-side length. Further, for the blocks in each longitudinal row, the exposure doses are successively varied to be successively increased from the lower side to the upper side so as to be respectively Q1, Q2, Q3, ... Qn(Q1≦Q2≦Q3≦ ... ≦Qm). The exposure doses for the blocks in each lateral row are equal to each other. After development of the block-exposed sample, the critical exposure doses are determined in connection with w and u with respect to the respective longitudinal block rows.

Figure 6A:
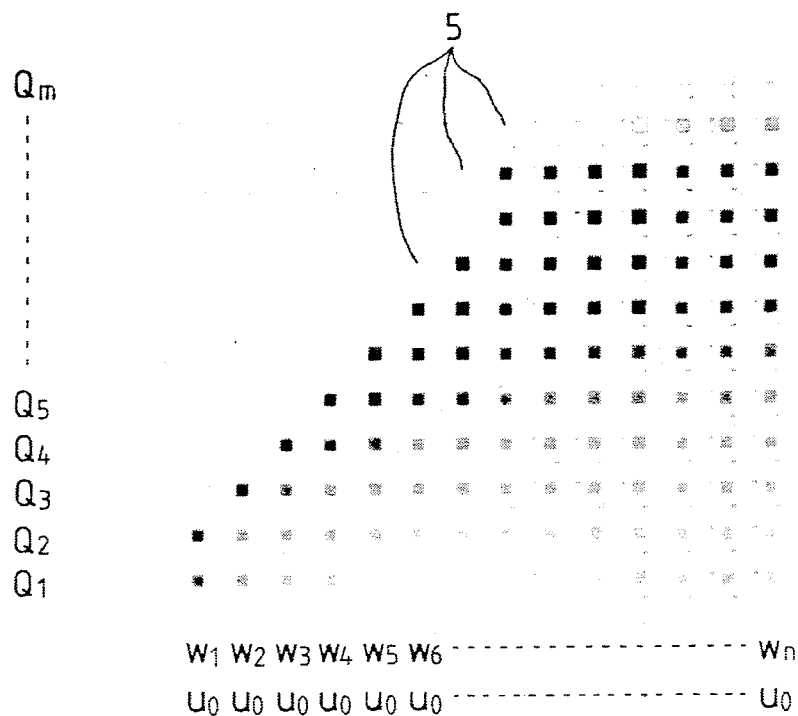
FIGS. 6A and 6B are illustrations of states after exposure and developement in the first embodiment.
Figure 6B:
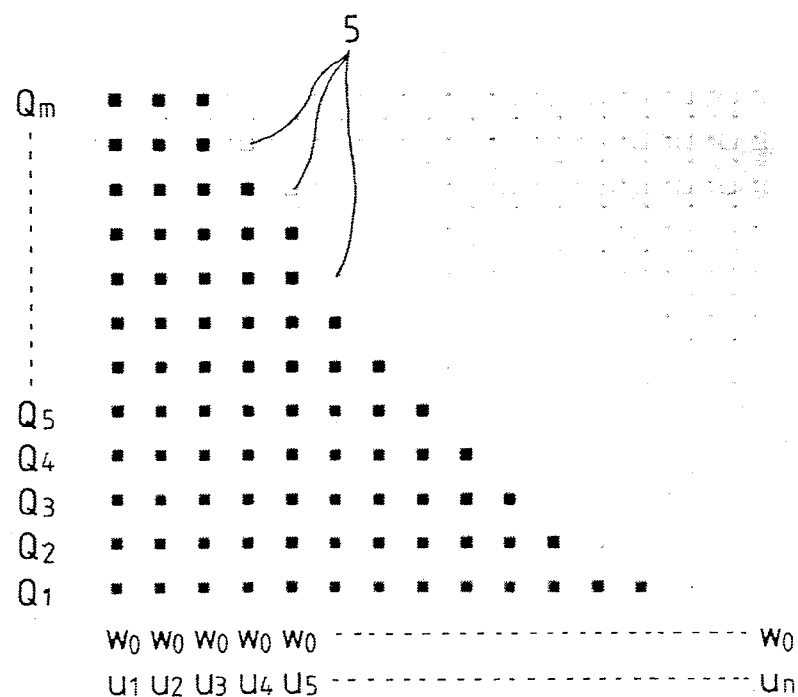

FIGS. 6A and 6B show the states of the FIG. 5 blocks observed by a 20-magnification optical microscope after exposure and developement. FIG. 6A illustrates the block states under the conditions that the non-exposed portion dimentions of the blocks in the lateral row are w1, w2, w3, ... wn, the exposed portion dimensions of the blocks in the lateral row are respectively uo(u1=u2=u3 .... =un=uo) and the exposure doses for the blocks in the longitudinal row are respectively Q1, Q2, Q3, ..., Qm. FIG. 6B illustrates the block states under the conditions that the non-exposed portion dimentions of the blocks in the lateral row are respectively wo(w1=w2=w3= ... =wn =wo), the exposed portion dimensions of the blocks in the lateral row are respectively u1, u2, u3, ..., un) and the exposure doses for the blocks in the longitudinal row are respectively Q1, Q2, Q3, ..., Qm. From FIGS. 6A and 6B, the blocks 5 corresponding to the critical exposure dose (in which the entire resist is removed) become clear.

Accordingly, it is possible to easily obtain the critical exposure $Q_E$ representing that the absorbed dose at the center of the non-exposed portion 3 becomes equal to the dissolved absorbed dose $Q_c$. Thus, by using these values w, u, $Q_c$ and $Q_E$ (here, w and u designate the integration region) with respect to the equation (3) for the center point of the non-exposed portion 3, it is possible to obtain the respective parameters α, β and η.

A description will be made hereinbelow in terms of a second embodiment of this invention. The second embodiment allows making uniform the absorbed dose distribution due to the back scattering irrespective of the exposed portions and non-exposed portions by utilizing the two-dimentional periodicity so as to simplify the equation (3). A description will be made hereinbelow in terms of a method of obtaining the periodicity of the two-dimentional periodic pattern in which the absorbed dose distribution due to the back scattering becomes uniform which is referred hereinafter to as a basic step).

A plurality of blocks each having a checked pattern are arranged longitudinally and laterally as illustrated in FIG. 5. In the blocks in each lateral row, the ratio of the areas of the exposed portion and the non-exposed portion is arranged to become constant. That is, $$\frac{\text{area of exposed portion}}{\text{area of exposed portion + area of non-exposed portion}} = \quad (4)$$

$$\frac{u^2 + 2u \cdot w}{(u + w)^2} = \xi$$

$$\frac{w^2}{(u + w)^2} = (1 - \xi)$$

In the equation (4), u and w are simultaneously changed so that ξ becomes ½. Thus, w and u are simultaneously increased so that in the blocks in the lateral row the ratio of the areas of the exposed portion and non-exposed portion becomes constant, and the whole blocks are exposed with the exposure dose being varied with respect to the blocks in each longitudinal row.

Figure 7:
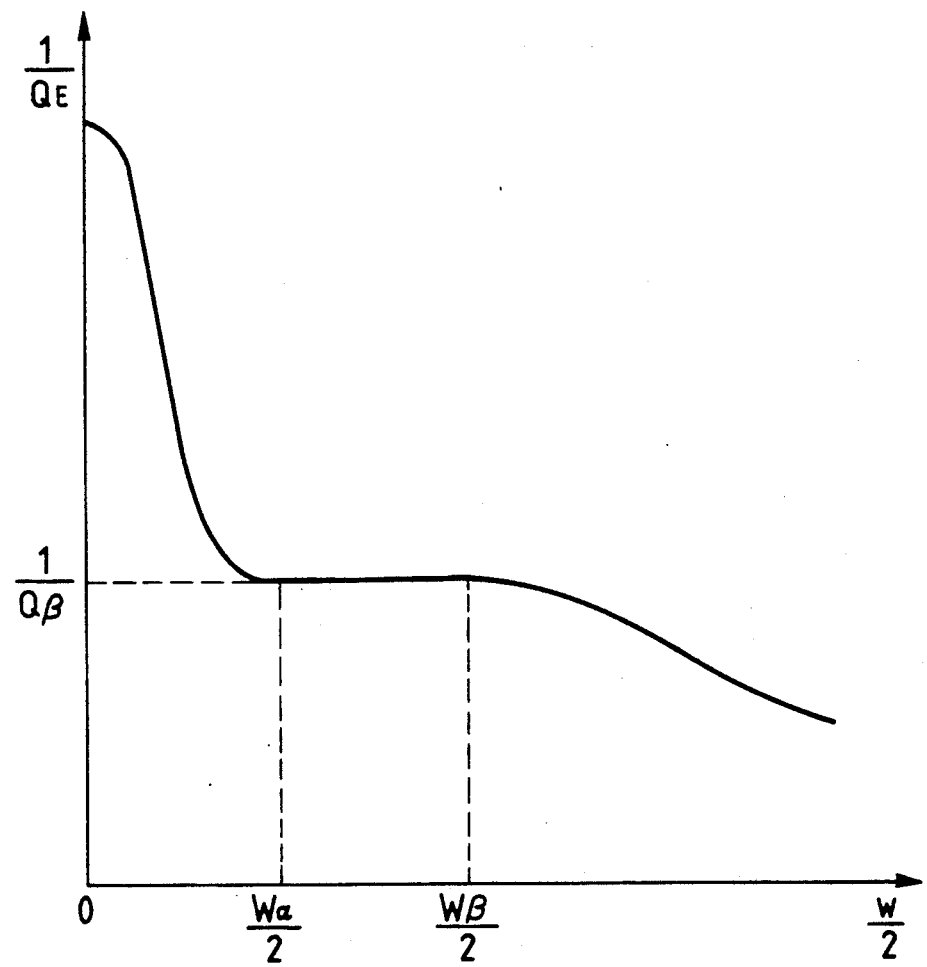
FIG. 7 is a graphic diagram showing the relation between critical exposure doses and dimensions of non-exposed portion in a second embodiment of the present invention.
Figure 8:
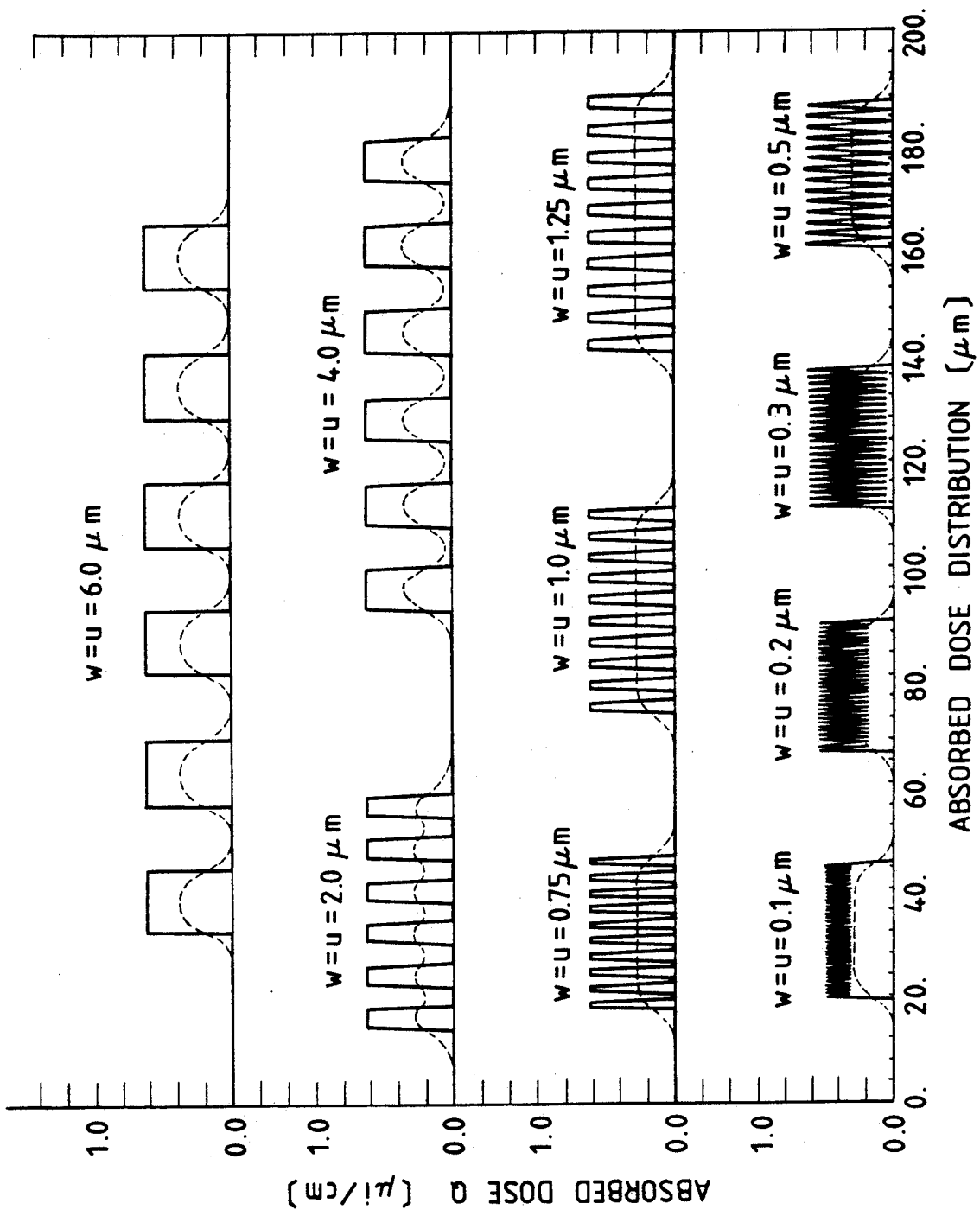
FIG. 8 is an illustration of absorbed dose distributions in the second embodiment of this invention.

FIG. 7 is a graphic illustration of a characteristic curve showing the relation between the critical exposure dose and the non-exposed portion. In FIG. 7, the critical exposure dose $Q_E$ is obtained with respect to the width w of the non-exposed portion and the relation between $1/Q_E$ and w/2 is plotted. FIG. 8 shows the absorbed dose distribution due to the forward scattering and the absorbed dose distribution due to the back scattering with respect to different widths u of the exposed portion and different widths w of the non-exposed portion on a line A—A of the basic exposure pattern illustrated in FIG. 4. In FIG. 8, solid lines represent the absorbed dose distributions due to the forward scattering and dotted lines represent the absorbed dose distributions due to the back scattering. The characteristic curve of FIG. 7 and the absorbed dose distribution diagram of FIG. 8 show the feature that the electron beam scattering intensity distribution is a square Gaussian distribution and the critical exposure deose $Q_E$ is stopped to be varied under the condition of α<<w+u<<β. That is, when exposing a checked pattern, if w≧$w_α$ (FIG. 7), we can completely disregard affection of the forward scattering with respect to the electron absorbed dose distribution, and when w+u≦2$w_β$, the affection of the back scattering with respect to the electron absorbed dose distribution does not depend upon w+u and further become uniform irrespective of the exposed portion and the non-exposed portion so as to depend on only the ratio of the areas of the exposed portion and non-exposed portion, whereby the value of $Q\beta$ (FIG. 7) can be obtained in accordance with the following equation.

$$\frac{1}{Q_\beta} = \frac{1}{Q_c} \cdot \frac{\eta}{1+\eta} \cdot \xi \tag{5}$$

With very simple methods, it is possible to obtain the respective parameters $\alpha$, $\beta$ and $\eta$ by using $W_\alpha$ and $W_\beta$ obtained in the above-described basic step. The methods will be described hereinbelow.

First Method of Otaininq Parameter $\eta$

Figure 9:
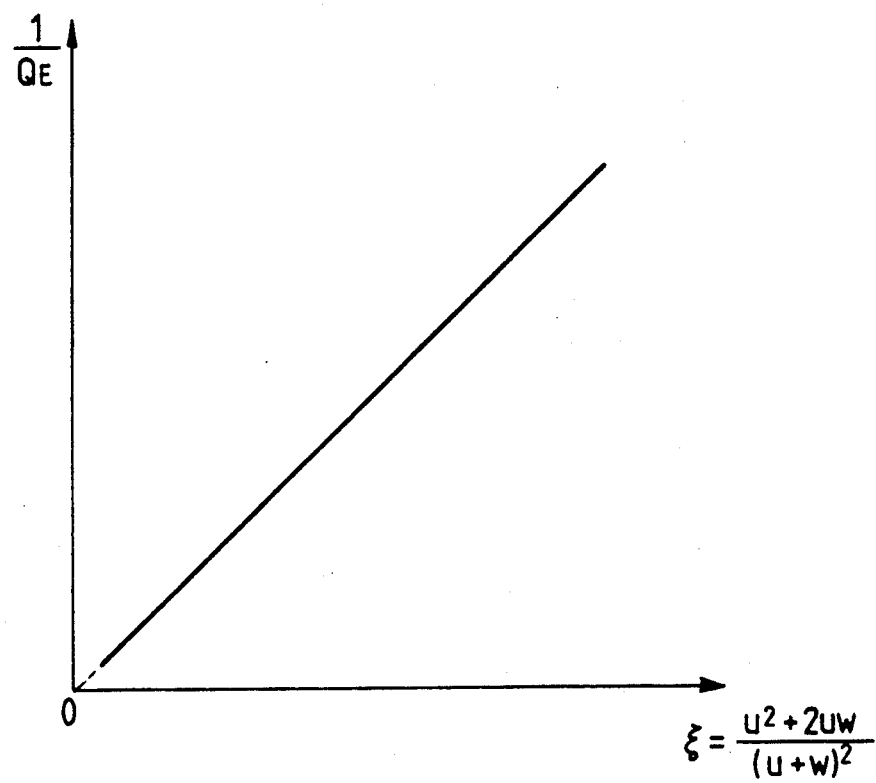
FIG. 9 is a characteristic curve diagram showing the relation of critical exposure doses with respect to areas of exposed portions in the second embodiment.

With the value of w of each block being fixed under the condition of $w+u \leq 2w_\beta$ and $W_\alpha \leq w$, the critical exposure $Q_E$ is obtained in connection with variation of the value of u, thereby plotting $1/Q_E$ relative to $\xi = u^2 + 2uw/(u+w)^2$ so as to obtain the characteristic (straight line) as illustrated in FIG. 9. At this time, in the right side of the equation (3) representing this straight line characteristic, the absorbed dose due to the forward scattering becomes zero under the condition of $w_\alpha \leq w$ and $w + u \leq 2w_\beta$, and the absorbed dose due to the back scattering is determined by the arears of the exposed portion and non-exposed portion, thereby resulting in being as follows.

$$\frac{\eta}{1+\eta} \cdot Q_E \cdot \xi \tag{6}$$

Accordingly, the equation (3) becomes as follows, thereby obtain $1/Q_c \cdot \eta/\eta + 1$ by the inclination of the straight line in FIG. 9 so as to obtain $\xi$ from Qc.

$$\frac{1}{Q_E} = \frac{1}{Q_c} \cdot \frac{\eta}{\eta+1} \cdot \xi \tag{7}$$

Second Method of Obtaining Parameter

With the width u of the exposed portion of each block being fixed under the condition of $w+u \leq 2w_\beta$ and $w_\alpha \leq w$, the dimension w of the non-exposed portion is varied so as to obtain the critical exposure dose $Q_E$ with respect to the different w, thereafter plotting $1/Q_E$ with respect to $\xi = u^2 + 2uw/(u+w)^2$ to similarly obtain the straight line characteristic as illustrated in FIG. 9 to obtain $\eta$ on the basis of the inclination of the FIG. 9 straight line.

Method of obtaining Parameter $\alpha$

Figure 10:
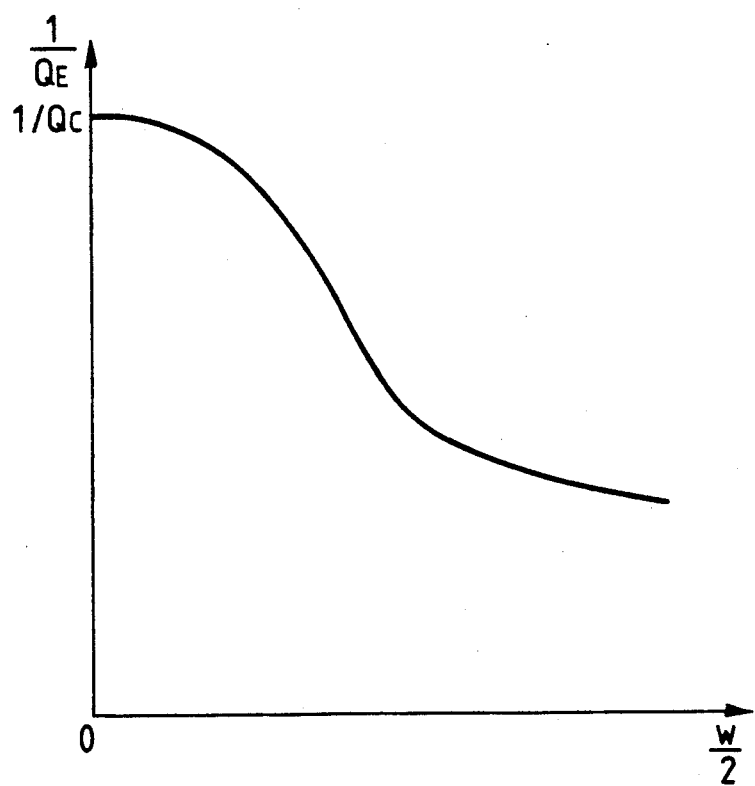
FIG. 10 is a graphic diagram showing the relation between critical exposure doses and non-exposed portions in the second embodiment.

With the values $w_\alpha$, $w_\beta$ *obtained in the above-described basic step, the width u of the exposed portion of each block is fixed under the condition of* $w_\alpha \leq u$ *and* $u+w \leq 2w_\beta$ *and the dimension w of the non-exposed portion of each block is then varied so as to obtain the critical exposure dose* $Q_E$ with respect to the varied w, thereby obtain a characteristic curve as illustrated in FIG. 10 by plotting $1/Q_E$ relative to w/2. At this time, if the right side of the equation (3) is expressed as (exposure does $Q_E$)−(absorbed does taken when the non-exposed portion is exposed with exposure dose $Q_E$), the absorbed dose due to the forward scattering is as follows.

$$\frac{Q_E}{1+\eta} - \frac{Q_E}{1+\eta} erf^2\left(\frac{w}{2\alpha}\right) \tag{8}$$

This is based upon the fact that, when considering the affection of the forward scattering under the above-mentioned condition, the respective non-exposed portions can be regarded as isolated patterns. Further, it is based upon the fact that the absorbed dose due to the back scattering can be expressed as follows.

$$Q_E \cdot \frac{\eta}{1+\eta} \cdot \xi \tag{9}$$

Thus, the equation (3) results in becoming as follows.

$$Q_c = Q_E \cdot \frac{1}{1+\eta}\left(1 - erf^2\left(\frac{w}{2\alpha}\right) + \eta \cdot \xi\right) \tag{10}$$

and $$\frac{1}{\alpha} \cdot \frac{w}{2} = erf^{-1}\left\{1 + \eta \cdot \xi - \frac{Q_c}{Q_E}(1+\eta)\right\}^{\frac{1}{2}} \tag{11}$$

Figure 11:
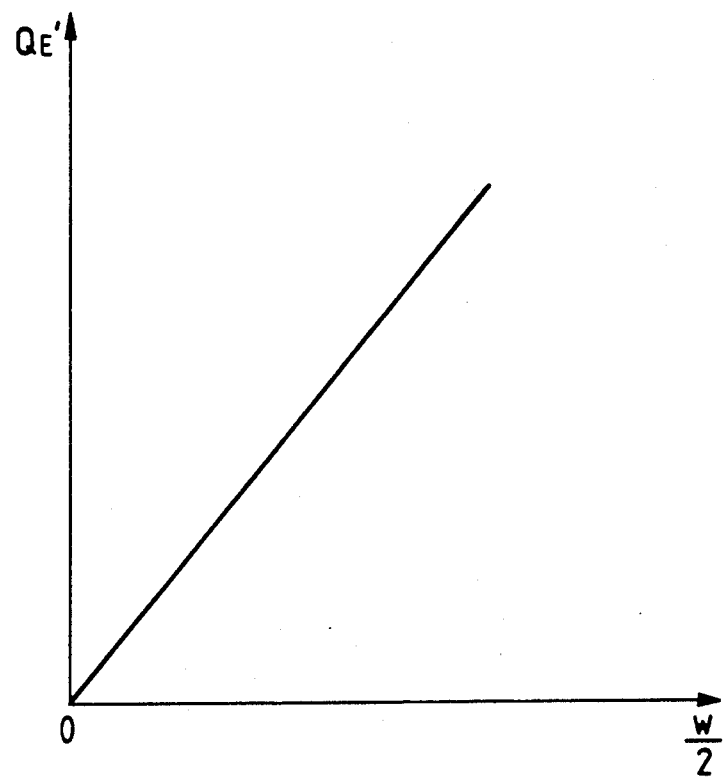
FIG. 11 is a graphic diagram showing the relation between critical exposure doses and non exposed portions in the second embodiment.

Thus, $Q_E'$ in FIG. 10 is rewritten as follows and w/2-to-$1/Q_E'$ is plotted, thereby obtaining a straight line as illustrated in FIG. 11 so as to obtain $1/\alpha$ from the inclination of this straight line.

$$Q_{E'} = erf^{-1}\left\{-\frac{Q_c}{Q_E}(1+\eta) + 1 + \eta \cdot \xi\right\}^{\frac{1}{2}} \tag{12}$$

First Method of Obtaining Parameter $\beta$

With the width u of the exposed portion of each block being fixed under the condition of $w_\beta \leq u$ and $w_\alpha \leq w$, the dimension w of the non-exposed portion thereof is varied so as to obtain the critical exposure dose $Q_E$ in accordance with the variation of the dimension w, and $Q_E$ is taken as follows.

$$Q_E = erf^{-1}\left\{-\frac{Q_c}{Q_E} \cdot \frac{(1+\eta)}{\eta} + 1\right\}^{\frac{1}{2}} \tag{13}$$

Then, by plotting w/2-to-$Q_E$ similarly obtains a straight line as illustrated in FIG. 11, thereby obtaining $1/\beta$ from the inclination of the straight line. This is based upon the following fact. That is, the absorbed dose due to the forward scattering becomes zero because of the condition of $w_\alpha \leq w$, and further because of the condition of $w_\beta \leq u$, similarly with respect to the back scattering, the non-exposed portion can be regarded as an isolated pattern. Therefore, the right side of the equation (3) becomes as follows.

$$\frac{\eta}{1+\eta} \cdot Q_E - \frac{\eta}{1+\eta} Q_E \, erf^2\left(\frac{w}{2\beta}\right) \tag{14}$$

Thus, the following equation can be obtained.

$$\frac{1}{\beta} \cdot \frac{w}{2} = erf^{-1}\left\{ \left( -\frac{Q_c}{Q_E} \cdot \frac{1+\eta}{\eta} + 1 \right) \right\}^{\frac{1}{2}} \quad (15)$$

Second Method of Obtaining Parameter $\beta$

With the width u of the exposed portion of each block being fixed under the condition of $u \leq w_\beta$ and $w_\alpha \leq w$, the dimension w of the non-exposed portion thereof is varied so as to obtain the critical exposure dose $Q_E$ with respect to the different w, and $(w/2)^2$-to-$lnQ_E$ is plotted to obtain a straight line as illustrated in FIG. 11. Here, because of the condition of $w_\alpha \leq w$, the absorbed dose due to the forward scattering becomes zero, and because of the condition of $u \leq w_\beta$, the integration for the back scattering in the equation (3) can be disregarded, whereby the following equation can be obtained.

$$\frac{1}{Q_E} \alpha\, e^{-(\frac{w}{2\beta})^2} \quad (16)$$

Thus, the following equation can be obtained.

$$-\frac{1}{\beta^2} \cdot \left(\frac{w}{2}\right)^2 \cdot \ln\frac{1}{Q_E} \quad (17)$$

Figure 12:
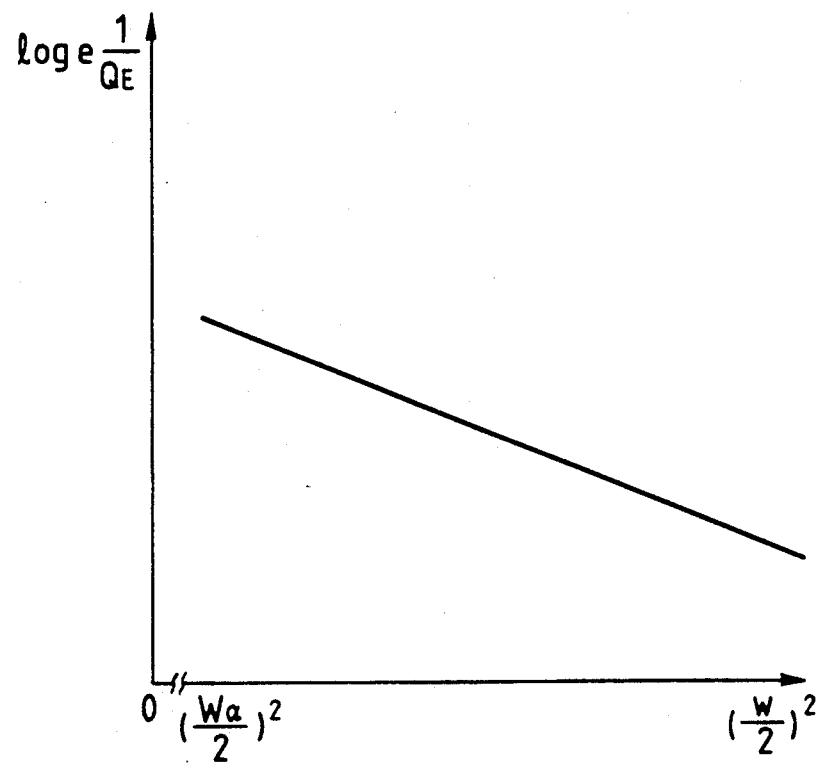
FIG. 12 is a graphic illustration of the relation between critical exposure doses and non exposed portions.

Accordingly, $1/\beta^2$ can be obtained on the basis of the inclination of the FIG. 12 straight line.

Accordingly, in the case of performing the proximity effect correction by this embodiment, it is possible to easily evaluate the important parameters $\eta$ and $\beta$ by the different methods so as to allow evaluation of the propriety of the modle functions of the electron beam scattering intensity distribution with comparison between $\eta$ and $\beta$.

Figure 13:
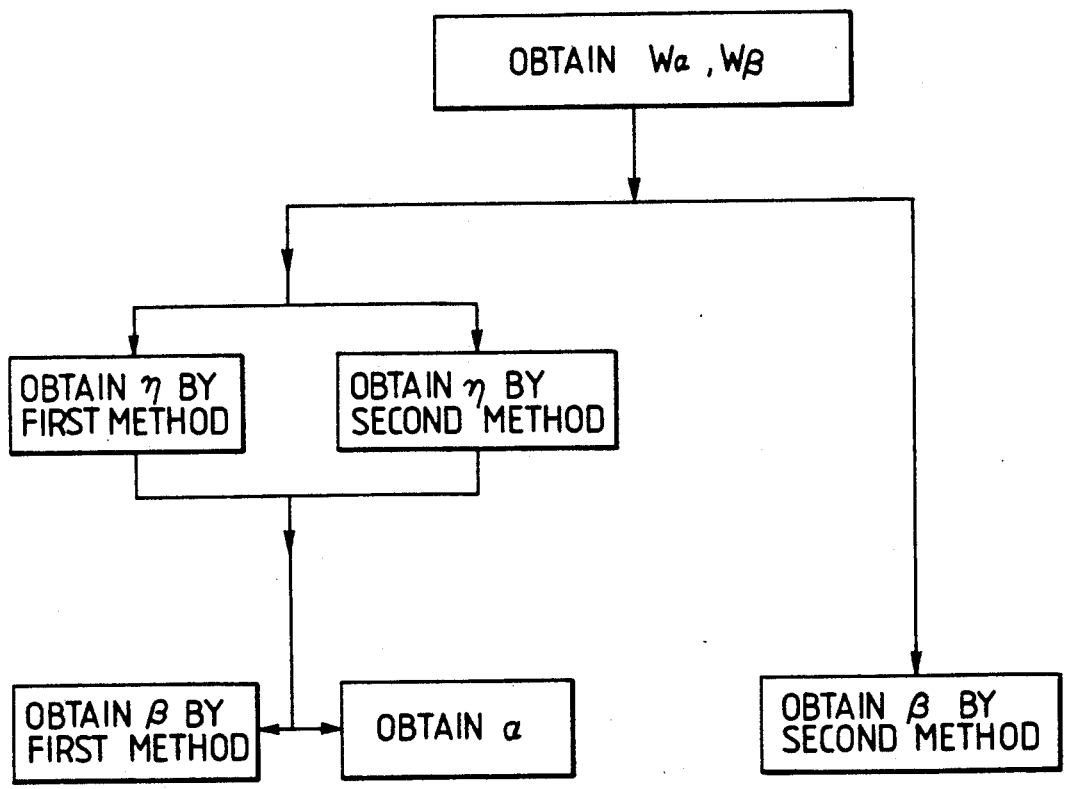
FIG. 13 is an illustration for describing the relation between methods of obtaining parameters on the electron scattering intensity distribution.

FIG. 13 shows the relation between the above-described methods of obtaining the respective parameters $\alpha$, $\beta$ and $\eta$. That is, the parameter $\eta$ is first obtained in accordance with the first and second methods of obtaining the parameter using the values $w_\alpha$ and $w_\beta$ obtained in the basic step, thereby obtain the parameters $\alpha$ and $\beta$. Whereas, the parameter $\beta$ can be obtained directly on the basis of the values $w_\alpha$ and $w_\beta$ in accordance with the second method of obtaining the parameter $\beta$.

Although the above-described embodiment is made for a positive resist, it is also appropriate that it is employed for a negative resist. In this case, a portion of the resist to be removed is left and the dissolved absorbed dose is changed to an insoluble absorbed does. In this embodiment, as the exposure pattern is used a pattern having a dimension which easily allows observation by an optical microscope and as observation data are used variation of the entire pattern. The entire pattern variation simultaneously occurs with respect to a number of portions of the resist which are under the same condition, and therefore the result of this embodiment corresponds to the average obtained by measuring the same phenomenon many times. Further, since all the parameters are obtained from the inclinations of the straight lines produced in accordance with the observation data, the respective parameters can be obtained as values from which dispersions of the exposure dimension and exposure dose of the exposure apparatus are cancelled.

It should be understood that the foregoing relates to only preferred embodiments of the present invention, and it is intended to cover all changes and modifications of the embodiments of this invention herein used for the purposes of the disclosure, which do not constitute departures from the spirit and scope of the invention.

What is claimed is:

1. A method of obtaining parameters including a forward scattering parameter, a back scattering parameter and a reflection coefficient parameter on an electron scattering intensity distribution expressed with a double Gaussian distribution obtained when exposing a resist with an electron beam, comprising the steps of:
    (a) preparing an evaluation pattern comprising a plurality of basic checked patterns each comprising longitudinal stripes and lateral stripes to form cross stripes, said plurality of basic checked patterns being successively arranged longitudinally and laterally at predetermined intervals on a plane so as to form a plurality of longitudinal pattern rows and a plurality of lateral pattern rows, and widths of said stripes of said basic checked patterns in each of said lateral pattern rows being successively changed so as to be different from each other;
    (b) exposing an resist, applied on a substrate, with an electron beam in accordance with said evaluation pattern so that portions of said stripes of each of said basic checked patterns are exposed and portions between said stripes thereof are non exposed, thereby obtaining an exposed pattern corresponding to said evaluation pattern, the exposure doses for said basic checked patterns in each of said longitudinal pattern rows being successively changed so as to be different at every basic checked pattern;
    (c) developing said evaluation-pattern exposed resist for a predetermined time period and then obtaining, as a critical exposure dose, the minimum exposure dose in each of said longitudinal pattern rows, where the widths of said stripes are constant, on the basis of removed or remaining states of the non-exposed portions of said basic checked patterns; and
    (d) obtaining said parameters of the electron scattering intensity distribution on the basis of the obtained critical exposure doses.

2. A method of obtaining parameters including a forward scattering parameter, a back scattering parameter and a reflection coefficient parameter on an electron scattering intensity distribution expressed with a double Gaussian distribution obtained when exposing a resist with an electron beam, comprising the steps of:
    (a) preparing an evaluation pattern comprising a plurality of basic checked patterns each comprising longitudinal stripes and lateral stripes to form cross stripes, said plurality of basic checked patterns being successively arranged longitudinally and laterally at predetermined intervals on a plane so as to form a plurality of longitudinal pattern rows and a plurality of lateral pattern rows, and dimensions between said stripes of said basic checked patterns in each of said lateral pattern rows being successively changed so as to be different at every basic checked pattern;
    (b) exposing an resist, applied on a substrate, with an electron beam in accordance with said evaluation pattern so that portions of said stripes of each of said basic checked patterns are exposed and portions between said stripes thereof are non exposed, thereby obtaining an exposed pattern corresponding to said evaluation pattern, the exposure doses for said basic checked patterns in each of said longitudinal pattern rows being successively changed so as to be different from each other;

(c) developing said evaluation-pattern exposed resist for a predetermined time period and then obtaining, as a critical exposure dose, the minimum exposure dose in each of said longitudinal pattern rows, where the dimensions between said stripes are constant, on the basis of removed or remaining states of the non-exposed portions of said basic checked patterns; and (d) obtaining said parameters of the electron scattering intensity distribution on the basis of the obtained critical exposure doses.

3. A method of obtaining a reflection coefficient parameter on an electron scattering intensity distribution expressed with a double Gaussian distribution obtained when exposing a resist with an electron beam, comprising the step of using an evaluation pattern comprising a plurality of basic checked patterns each comprising longitudinal stripes and lateral stripes to form cross stripes, where the sum of the width of each of said stripes and the interval between said stripes is smaller in dimension than an electron back scattering length of the electron beam and the interval therebetween is greater in dimension than an electron forward scattering length of the electron beam.

4. A method of obtaining a forward scattering parameter on an electron scattering intensity distribution expressed with a double Gaussian distribution obtained when exposing a resist with an electron beam, comprising the step of using an evaluation pattern comprising a plurality of basic checked patterns each comprising longitudinal stripes and lateral stripes to form cross stripes, where the sum of the width of each of said stripes and the interval between said stripes is smaller in dimension than an estimated electron back scattering length of the electron beam and the width thereof is greater in dimension than an electron electron forward scattering length of the electron beam.

5. A method of obtaining a back scattering parameter on an electron scattering intensity distribution expressed with a double Gaussian distribution obtained when exposing a resist with an electron beam, comprising the step of using an evaluation pattern comprising a plurality of basic checked patterns each comprising longitudinal stripes and lateral stripes to form cross stripes, where the interval between said stripes is greater in dimension than an estimated electron forward scattering lenqth of the electron beam and the width of each of said stripes is greater in dimension than an estimated electron back scattering length of the electron beam.

6. A method of obtaining a back scattering parameter on an electron scattering intensity distribution expressed with a double Gaussian distribution obtained when exposing a resist with an electron beam, comprising the step of using an evaluation pattern comprising a plurality of basic checked patterns each comprising longitudinal stripes and lateral stripes to form cross stripes, where the interval between said stripes is greater in dimension than an estimated electron forward scattering length of the electron beam and the width of each of said stripes is smaller in dimension than an estimated electron back scattering length of the electron beam.

* * * * *